(12) United States Patent  
Yu

(10) Patent No.: US 6,778,627 B2  
(45) Date of Patent: Aug. 17, 2004

(54) SHIFT-REGISTER CIRCUIT

(75) Inventor: Jian-Shen Yu, Hsinchu (TW)

(73) Assignee: AU Optronics Corp., Hsinchu (TW)

( * ) Notice: Subject to any disclaimer, the term of this patent is extended or adjusted under 35 U.S.C. 154(b) by 0 days.

(21) Appl. No.: 10/410,951

(22) Filed: Apr. 10, 2003

(65) Prior Publication Data

US 2004/0028172 A1 Feb. 12, 2004

(30) Foreign Application Priority Data

Aug. 8, 2002 (TW) ........................................ 91117864 A

(51) Int. Cl.[7] ............................................. G11C 19/00
(52) U.S. Cl. .......................... 377/72; 377/75; 377/79; 377/80; 345/100
(58) Field of Search ............................ 377/72, 75, 79, 377/80; 345/100

(56) References Cited

U.S. PATENT DOCUMENTS 4,733,111 A * 3/1988 Fassino et al. .............. 327/203

6,339,631 B1 * 1/2002 Yeo et al. ..................... 377/64
6,621,886 B2 * 9/2003 Kawahata ..................... 377/1

* cited by examiner

Primary Examiner—Margaret Wambach
(74) Attorney, Agent, or Firm—Fish & Richardson P.C.

(57) ABSTRACT

A shift-register circuit. The PMOS transistor includes a first gate for receiving an inverted output signal output from a previous stage shift-register unit, a first source for receiving an output signal from the previous stage shift-register unit, and a first drain. The first NMOS transistor includes a second gate coupled to the first drain, a second drain coupled to the clock signal and a second source. The capacitor is coupled between the second gate and the second source. The second NMOS transistor includes a third gate coupled to the first source, a third drain coupled to the second source and a third source coupled to the ground level. The third NMOS transistor includes a fourth gate coupled to an output of a next stage shift-register unit, a fourth drain coupled to a connection point of the second gate and the capacitor and a fourth source coupled to the ground level. The first inverter is coupled to a connection point of the first NMOS transistor and the second NMOS transistor to output an inverted output signal. The second inverter is coupled to the first inverter to output an output signal.

7 Claims, 5 Drawing Sheets

US 6,778,627 B2

SHIFT-REGISTER CIRCUIT

CROSS REFERENCE TO RELATED APPLICATIONS

Pursuant to 35 USC §119, this application claims the benefit of Taiwan Patent Application No. 91117864 filed Aug. 8, 2002.

BACKGROUND OF THE INVENTION

1. Field of the Invention

The present invention relates in general to a shift-register circuit. In particular, the present invention relates to a shift-register circuit of a liquid crystal display (LCD) driver.

2. Description of the Related Art

FIG. 1 shows the conventional shift-register circuit disclosed by U.S. Pat. No. 5,410,583 in 1995. Only the single shift-register unit is shown in FIG. 1. The shift-register units connected in serial compose a complete shift-register circuit. In FIG. 1, the input signal is input to the input terminal INPUT and switches the NMOS transistor 12 through the source of the NMOS transistor 10. The output terminal OUTPUT outputs the clock signal C1 when the NMOS transistor 12 is turned on. However, the turned on NMOS transistor 10 acts as a diode, which lowers the voltage level of the signal controlling the NMOS transistor 12.

Clock signal C2 switches the NMOS transistor 14, and the NMOS transistors 14 and 16 are turned on to lower the voltage level of the output terminal OUTPUT when the clock signal C2 is at high voltage level. In addition, the output signal of the next two stage shift-register unit is fed back to the gate of the NMOS transistor 18 to switch the NMOS transistor 18. The voltage level of the gate of the NMOS transistor 12 is lowered quickly when the NMOS transistor 18 is turned on. Thus, the NMOS transistor 12 is turned off and the output terminal stops outputting data.

However, the conventional shift-register circuit requires two clock signals C1 and C2. Thus, the pulse generator must generate more parasitical capacitance, and power consumption is increased. In addition, the layout of the conventional shift-register circuit is complicated because the present shift-register unit is controlled by the next two stage shift-register unit.

SUMMARY OF THE INVENTION

The object of the present invention is thus to provide a shift-register circuit comprising a plurality of shift-register units, each inputting a single clock signal, such that the parasitical capacitance at the signal source is decreased. In addition, each shift-register unit receives the output signals from the previous and the next shift-register units. Thus, the circuit layout is simplified.

To achieve the above-mentioned object, the present invention provides a shift-register circuit having a plurality of shift-register units connected in serial for a clock signal, a first voltage, and a second voltage. The first transistor includes a first gate coupled to an output of a previous stage shift-register unit, and a first drain coupled to the first voltage and a first source. The second transistor includes a second gate coupled to an output of a next stage shift-register unit, a second drain coupled to the first source and a second source coupled to the second voltage. The third transistor has a third gate coupled to the second gate, a third drain coupled to the first voltage and a third source. The fourth transistor includes a fourth gate coupled to the first gate, a fourth drain coupled to the third source and a fourth source coupled to the second voltage. The fifth transistor includes a fifth gate coupled to the third source, a fifth drain coupled to a connection point of the first source and the second drain and a fifth source coupled to the second voltage. The sixth transistor includes a sixth gate coupled to the fifth drain, a sixth drain coupled to the clock signal and a sixth source coupled to an output terminal. The seventh transistor includes a seventh gate coupled to the fifth gate, a seventh drain coupled to the output terminal and a seventh source coupled to the second voltage.

In addition, the present invention provides a shift-register circuit having a plurality of shift-register units connected in serial for a clock signal and ground level. The PMOS transistor includes a first gate for receiving an inverted output signal output from an output of a previous stage shift-register unit, a first source for receiving an output signal output from the output of the previous stage shift-register unit and a first drain. The first NMOS transistor includes a second gate coupled to the first drain, a second drain coupled to the clock signal and a second source. The capacitor is coupled between the second gate and the second source. The second NMOS transistor includes a third gate coupled to the first source, a third drain coupled to the second source and a third source coupled to the ground level. The third NMOS transistor includes a fourth gate coupled to an output of a next stage shift-register unit, a fourth drain coupled to a connection point of the second gate and the capacitor and a fourth source coupled to the ground level. The first inverter is coupled to a connection point of the first NMOS transistor and the second NMOS transistor to output an inverted output signal. The second inverter is coupled to the first inverter to output an output signal.

BRIEF DESCRIPTION OF THE DRAWINGS

The present invention will become more fully understood from the detailed description given hereinbelow and the accompanying drawings, given by way of illustration only and thus not intended to be limitative of the present invention.

DETAILED DESCRIPTION OF THE INVENTION

The present invention provides a shift-register circuit comprising a plurality of shift-register units. The detailed circuit of the shift-register unit is described in the following embodiments.

First Embodiment

Figure 1:
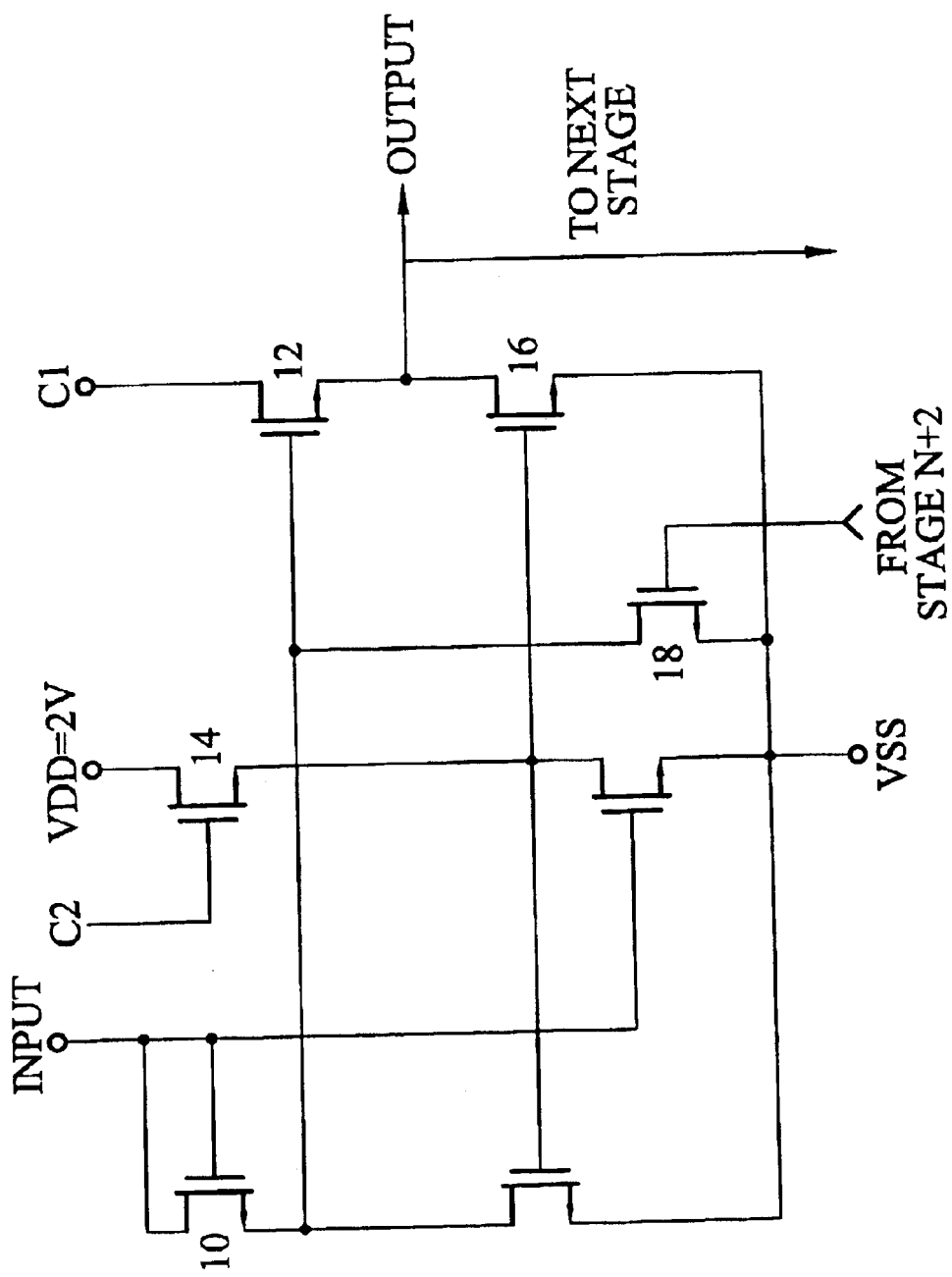
FIG. 1 shows a conventional shift-register circuit.
Figure 2:
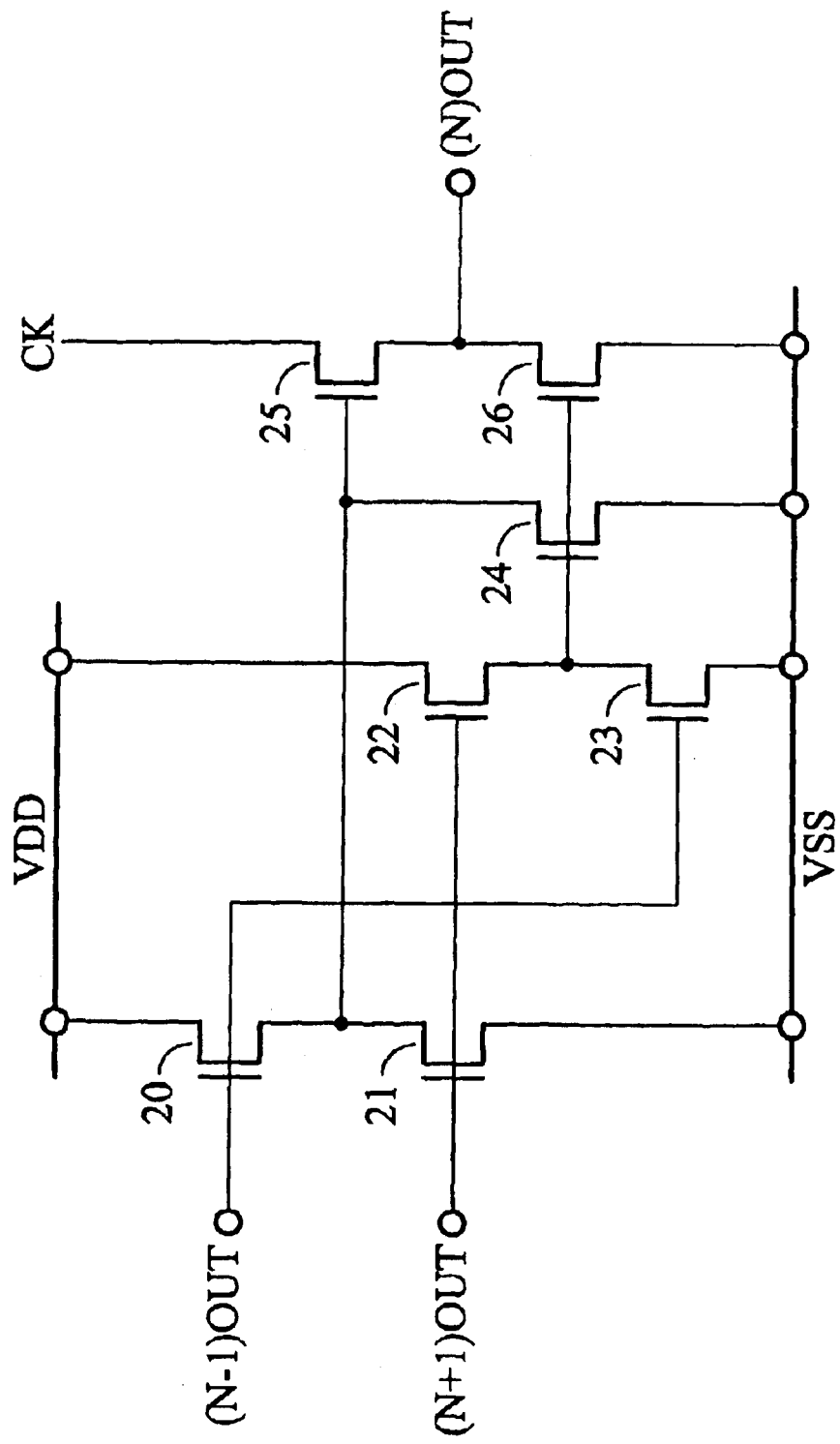
FIG. 2 shows the circuit of the shift-register unit according to the first embodiment of the present invention.

FIG. 2 shows the circuit of the shift-register unit according to the first embodiment of the present invention. Here, only one shift-register unit is shown in FIG. 2. For example, the shift-register unit is the (N)th stage of the shift-register circuit.

The NMOS transistor 20 comprises a first gate, a first drain and a first source. The first gate is coupled to the output terminal (N−1)OUT of the previous-stage shift-register unit and the first drain is coupled to the first voltage VDD. The NMOS transistor 21 comprises a second gate, a second drain and a second source. The second gate is coupled to the output terminal (N+1)OUT of the next-stage shift-register unit, the second drain is coupled to the first source and the second source is coupled to the second voltage VSS. The NMOS transistor 22 comprises a third gate, a third drain and a third source. The third gate is coupled to the second gate and the third drain is coupled to the first voltage VDD. The NMOS transistor 23 comprises a fourth gate, a fourth drain and a fourth source. The fourth gate is coupled to the first gate, the fourth drain is coupled to the third source and the fourth source is coupled to the second voltage VSS. The NMOS transistor 24 comprises a fifth gate, a fifth drain and a fifth source. The fifth gate is coupled to the third gate, the fifth drain is coupled to the connection point of the first source and the second drain, and the fifth source is coupled to the second voltage VSS. The NMOS transistor 25 comprises a sixth gate, a sixth drain and a sixth source. The sixth gate is coupled to the fifth drain, the sixth drain is coupled to the clock signal CK and the sixth source is an output terminal (N)OUT. The NMOS transistor 26 comprises a seventh gate, a seventh drain and a seventh source. The seventh gate is coupled to the fifth gate, the seventh drain is coupled to the output terminal (N)OUT and the seventh source is coupled to the second voltage VSS.

The NMOS transistor 20 is turned on when its gate receives the high voltage output from the output terminal (N−1)OUT of the previous stage ((N−1) stage) shift-register unit. Thus, the first voltage VDD turns on the NMOS transistor 25 through the NMOS transistor 20. Therefore, the clock CK is output to the next-stage shift-register unit from the output terminal (N)OUT. In addition, the output of the next shift-register unit is fed back to the gates of the NMOS transistors 21 and 22. Thus, when the next shift-register unit outputs a high-level signal, the NMOS transistor 22 is turned on, and the first voltage VDD turns on the NMOS transistor 24. The turned on NMOS transistors 21 and 24 lower the voltage level of the gate of the NMOS transistor 25, so the NMOS transistor 25 is turned off and stops outputting data.

Figure 3:
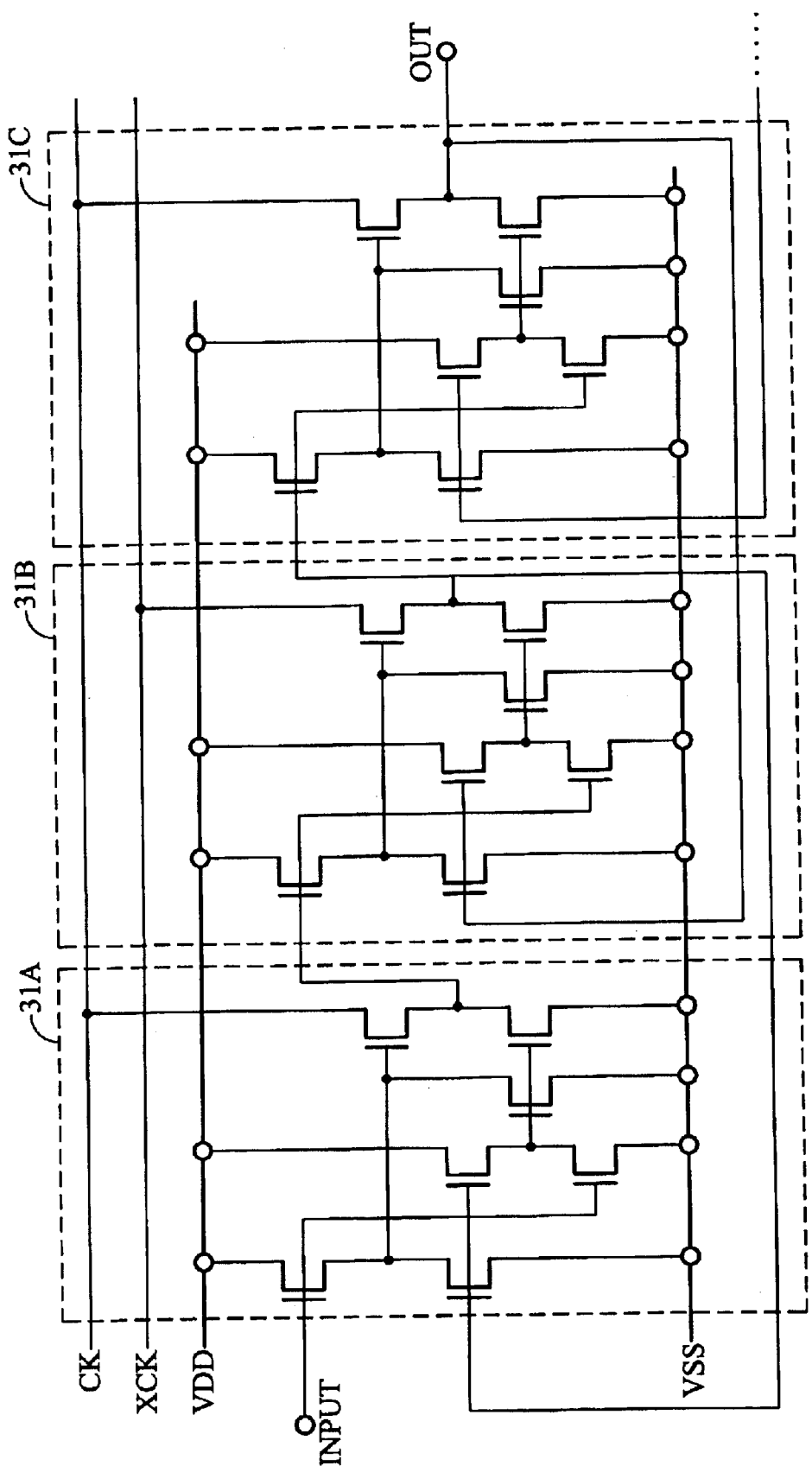
FIG. 3 shows a skeleton diagram of the shift-register units according to the first embodiment of the present invention.
Figure 4:
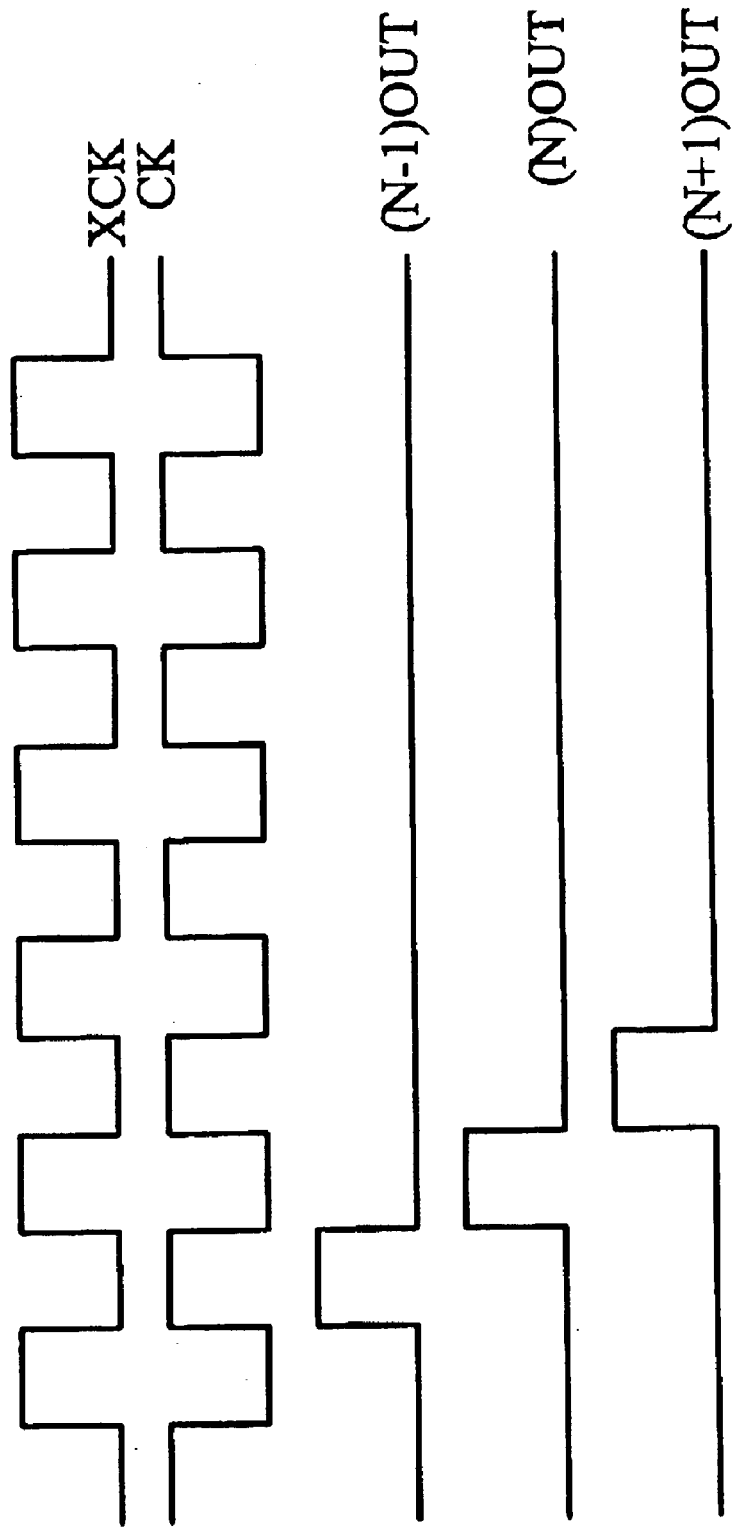
FIG. 4 shows a timing chart of the shift-register circuit according to the embodiment of the present invention.

FIG. 3 shows a skeleton diagram of the shift-register units according to the first embodiment of the present invention. The labels 31A–31C represent the shift-register units connected in serial. FIG. 4 shows a timing chart of the shift-register circuit according to the embodiment of the present invention. (N−1)OUT represents the output of the shift-register unit 31A, (N)OUT represents the output of the shift-register unit 31B and (N+1)OUT represents the output of the shift-register unit 31C. As shown in FIG. 4, each shift-register unit of the shift-register circuit according to the embodiment of the present invention outputs a pulse after the previous stage shift-register unit outputs a pulse in a predetermined period. Thus, the requirement of the shift-register circuit is achieved.

Second Embodiment

Figure 5:
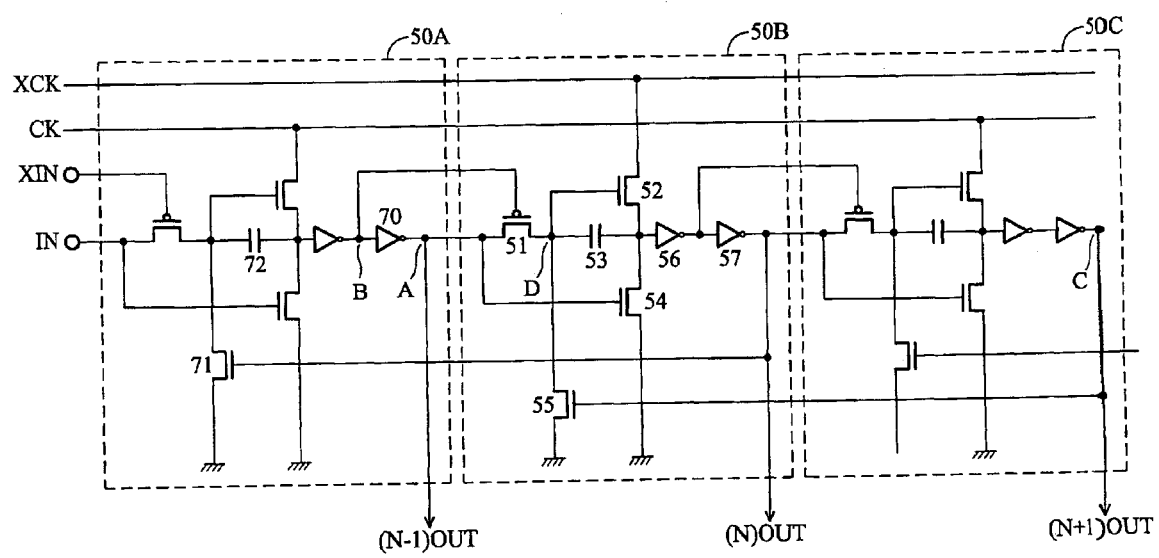
FIG. 5 shows a shift-register circuit according to the second embodiment of the present invention.

FIG. 5 shows a shift-register circuit according to the second embodiment of the present invention. Labels 50A–50C represent the shift-register units connected in serial. The circuit of the shift-register unit 50B is described below. Here, the shift-register unit 50B is the (N)th shift-register unit, the shift-register unit 50A is the (N−1)th shift-register unit and the shift-register unit SOC is the (N+1)th shift-register unit.

The source of the PMOS transistor 51 receives the output signal output from the output terminal A of the shift-register unit 50A, its gate receives the inverted output signal output from the output of a previous stage shift-register unit 50A. The inverted output signal is output from the node B. An inverter 70 is coupled between the nodes A and B. The gate of the NMOS transistor 52 is coupled to the drain of the PMOS transistor 51, and its gate receives the clock signal XCK. The PMOS transistor 51 improves on the disadvantage of the decreasing of the input signal caused by the NMOS transistor.

A capacitor 53 is coupled between the gate and the source of the NMOS transistor 52. The gate of the NMOS transistor 54 is coupled to the output terminal A of the shift-register unit 50A, its drain is coupled to the source of the NMOS transistor 52 and its source is coupled to ground. The gate of the NMOS transistor 55 is coupled to the output of the next stage shift-register unit 50C, its drain is coupled to the connection point of the NMOS transistor 52 and the capacitor 53, and its source is coupled to ground. The positive electrode of the inverter 56 is coupled to the connection point of the source of the NMOS transistor 52 and the drain of the NMOS transistor 54 to output an inverted output signal. The inverter 57 is coupled to the inverter 56 to output an output signal inverted to the inverted output signal.

When the clock signal CK of the shift-register unit 50A is at high voltage level, the output terminal A of the shift-register unit 50A outputs a high voltage level signal and the node B is at low voltage level. Thus, the PMOS transistor 51 and the NMOS transistor 54 are turned on and the voltage level of the node D is increased. Thus, a voltage difference is generated between both sides of the capacitor 53. When the clock signal CK of the shift-register unit 50A becomes low voltage level, the clock signal XCK input to the shift-register unit 50B is at high voltage level. The NMOS transistor 54 is turned off because the output terminal A of the shift-register unit 50A outputs a low voltage level signal. The voltage difference generated between the capacitor 53 turns on the NMOS transistor 52 so the shift-register unit 50B outputs a high voltage level signal and turns on the NMOS transistor 71. Thus, the voltage difference generated between the capacitor 53 is eliminated.

FIG. 4 shows a timing chart of the shift-register circuit according to the embodiment of the present invention. As shown in FIG. 4, each shift-register unit of the shift-register circuit according to this embodiment of the present invention outputs a pulse after the previous stage shift-register unit outputs a pulse in a predetermined period. Thus, the requirement of the shift-register circuit is achieved.

Accordingly, the shift-register circuit of the present invention comprises a plurality of shift-register units, each of which inputs a single clock signal. Thus, the parasitical capacitance at the signal source is decreased. In addition, each shift-register unit receives the output signals from the previous and the next shift-register units. Thus, the circuit layout is simplified.

The foregoing description of the preferred embodiments of this invention has been presented for purposes of illustration and description. Obvious modifications or variations are possible in light of the above teaching. The embodiments were chosen and described to provide the best illustration of the principles of this invention and its practical application to thereby enable those skilled in the art to utilize the invention in various embodiments and with various modifications as are suited to the particular use contemplated. All such modifications and variations are within the scope of the present invention as determined by the appended claims when interpreted in accordance with the breadth to which they are fairly, legally, and equitably entitled.

What is claimed is:

1. A shift-register circuit having a plurality of shift-register units connected in serial for a clock signal, a first voltage and a second voltage, comprising:

a first transistor having a first gate coupled to an output of a previous-stage shift-register unit, a first drain coupled to the first voltage and a first source;

a second transistor having a second gate coupled to an output of a next-stage shift-register unit, a second drain coupled to the first source and a second source coupled to the second voltage;

a third transistor having a third gate coupled to the second gate, a third drain coupled to the first voltage and a third source;

a fourth transistor having a fourth gate coupled to the first gate, a fourth drain coupled to the third source and a fourth source coupled to the second voltage;

a fifth transistor having a fifth gate coupled to the third source, a fifth drain coupled to a connection point of the first source and the second drain and a fifth source coupled to the second voltage;

a sixth transistor having a sixth gate coupled to the fifth drain, a sixth drain coupled to the clock signal and a sixth source coupled to an output terminal; and a seventh transistor having a seventh gate coupled to the fifth gate, a seventh drain coupled to the output terminal and a seventh source coupled to the second voltage.

2. The shift-register circuit as claimed in claim 1, wherein the first transistor, the second transistor, the third transistor, the fourth transistor, the fifth transistor, the sixth transistor and the seventh transistor are NMOS transistors.

3. A shift-register circuit for a data signal, a clock signal, a first voltage and a second voltage, comprising:

a first transistor having a first gate coupled to a first input signal, a first drain coupled to the first voltage and a first source;

a second transistor having a second gate coupled to a second input signal, a second drain coupled to the first source and a second source coupled to the second voltage;

a third transistor having a third gate coupled to the second gate, a third drain coupled to the first voltage and a third source;

a fourth transistor having a fourth gate coupled to the first gate, a fourth drain coupled to the third source and a fourth source coupled to the second voltage;

a fifth transistor having a fifth gate coupled to the third source, a fifth drain coupled to a connection point of the first source and the second drain and a fifth source coupled to the second voltage;

a sixth transistor having a sixth gate coupled to the fifth drain, a sixth drain coupled to the clock signal and a sixth source coupled to an output terminal; and a seventh transistor having a seventh gate coupled to the fifth gate, a seventh drain coupled to the output terminal and a seventh source coupled to the second voltage.

4. The shift-register circuit as claimed in claim 3, wherein the first transistor, the second transistor, the third transistor transistors, the fourth transistor, the fifth transistor, the sixth transistor and the seventh transistor are NMOS transistors.

5. The shift-register circuit as claimed in claim 3, further comprising a previous-stage shift-register unit for providing the first input signal.

6. The shift-register circuit as claimed in claim 3, further comprising a next-stage shift-register unit for providing the second input signal.

7. A shift-register circuit having a plurality of shift-register units connected in serial for a clock signal and ground level, comprising:

a PMOS transistor having a first gate for receiving an inverted output signal output from an output of a previous-stage shift-register unit, a first source for receiving an output signal output from the output of the previous-stage shift-register unit and a first drain;

a first NMOS transistor having a second gate coupled to the first drain, a second drain coupled to the clock signal and a second source;

a capacitor coupled between the second gate and the second source;

a second NMOS transistor having a third gate coupled to the first source, a third drain coupled to the second source and a third source coupled to the ground level;

a third NMOS transistor having a fourth gate coupled to an output of a next-stage shift-register unit, a fourth drain coupled to a connection point of the second gate and the capacitor and a fourth source coupled to the ground level;

a first inverter coupled to a connection point of the first NMOS transistor and the second NMOS transistor to output an inverted output signal; and a second inverter coupled to the first inverter to output an output signal.

* * * * *